(12) United States Patent
Lin

(10) Patent No.: US 6,797,608 B1
(45) Date of Patent: Sep. 28, 2004

(54) METHOD OF FORMING MULTILAYER DIFFUSION BARRIER FOR COPPER INTERCONNECTIONS

(75) Inventor: Jing-Cheng Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 09/587,465

(22) Filed: Jun. 5, 2000

(51) Int. Cl.$^7$ .......................................... H01L 21/4763
(52) U.S. Cl. ..................... 438/627; 438/643; 438/648; 438/653; 438/683; 438/687
(58) Field of Search ................. 438/605, 618, 438/622, 626, 627, 628, 643, 648, 653, 656, 683, 685, 687, 563

(56) References Cited

U.S. PATENT DOCUMENTS

| | | | |
|---|---|---|---|
| 5,801,098 A | 9/1998 | Fiordalice et al. | 438/653 |
| 5,907,188 A | 5/1999 | Nakajima et al. | 257/751 |
| 5,942,799 A * | 8/1999 | Danek et al. | 257/751 |
| 5,968,333 A | 10/1999 | Nogami et al. | 205/184 |
| 5,985,762 A | 11/1999 | Geffken et al. | 438/687 |
| 5,990,008 A * | 11/1999 | Koyama et al. | 438/687 |
| 6,001,415 A | 12/1999 | Nogami et al. | 427/97 |
| 6,054,382 A * | 4/2000 | Hsu et al. | 438/628 |
| 6,181,012 B1 * | 1/2001 | Edelstein et al. | 257/762 |
| 6,194,310 B1 * | 2/2001 | Hsu et al. | 438/643 |
| 6,291,332 B1 * | 9/2001 | Yu et al. | 438/618 |

* cited by examiner

Primary Examiner—Alonzo Chambliss
Assistant Examiner—Asok Kumar Sarkar
(74) Attorney, Agent, or Firm—Haynes and Boone, LLP

(57) ABSTRACT

It is a general object of the present invention to provide an improved method of fabrication in the formation of an improved copper metal diffusion barrier layer having the structure, W/WSiN/WN, in single and dual damascene interconnect trench/contact via processing with 0.10 micron nodes for MOSFET and CMOS applications. The diffusion barrier is formed by depositing a tungsten nitride bottom layer, followed by an in situ $SiH_4/NH_3$ or $SiH_4/H_2$ soak forming a WSiN layer, and depositing a final top layer of tungsten. This invention is used to manufacture reliable metal interconnects and contact vias in the fabrication of MOSFET and CMOS devices for both logic and memory applications and the copper diffusion barrier formed, W/WSiN/WN, passes a stringent barrier thermal reliability test at 400° C. Pure single barrier layers, i.e., single layer WN, exhibit copper punch through or copper spiking during the stringent barrier thermal reliability test at 400° C.

26 Claims, 2 Drawing Sheets

METHOD OF FORMING MULTILAYER DIFFUSION BARRIER FOR COPPER INTERCONNECTIONS

BACKGROUND OF THE INVENTION (1) Field of the Invention

This invention relates to a method of fabrication in the formation of an improved copper metal diffusion barrier layer, W/WSiN/WN, by a combination of a tungsten nitride bottom layer, followed by an in situ silane soak process forming a WSiN layer, and a final top layer of tungsten, in single and dual damascene interconnect trench/contact via processing with 0.10 micron nodes for MOSFET and CMOS applications.

(2) Description of Related Art

Related patents and relevant literature now follow as Prior Art.

U.S. Pat. No. 6,001,415 entitled "Via With Barrier Layer for Impeding Diffusion of Conductive Material from Via Into Insulator" granted Dec. 14, 1999 to Nogarni et al. describes a method of forming various diffusion barrier layers, i.e., both pure WSiN and pure WN barrier layers, for conducting copper contact vias. The via structure described includes a barrier layer disposed between a via plug and an insulating layer surrounding a via hole to impede diffusion of conductive material from the via plug into the insulating layer. The deposition of the barrier metals described use an ion metal plasma sputtering process that is combined with a plasma etching process to remove unwanted barrier layer material from the bottom of the contact via.

U.S. Pat. No. 5,801,098 entitled "Method of Decreasing Resistivity in an Electrically Conductive Layer" granted Sep. 1, 1998 to Fiordalice et al. describes a method of decreasing resistivity in an electrically conductive, diffusion barrier layer of TiN, that includes the use of a high density plasma sputtering technique to deposit the electrically conductive TiN layer. The electrically conductive diffusion barrier layer is further exposed to a plasma anneal.

U.S. Pat. No. 5,968,333 entitled "Method of Electroplating a Copper or Copper Alloy Interconnect" granted Oct. 19, 1999 to Nogami et al. describes a process whereby copper or a copper alloy is electroplated to fill via/contact holes and/or trenches in a dielectric layer. A barrier layer is initially deposited on the dielectric layer lining the hole/trench. A thin conformal layer of copper or a copper alloy is sputter deposited on the barrier layer outside the hole/trench. Copper or a copper alloy is then electroplated on the conformal copper or copper alloy layer filling the hole/trench. During electroplating, the barrier layer functions as a seed layer within the hole/trench. The barrier layer materials include single layers of: W, WN, WSiN, TiN, TiSiN and TiW.

U.S. Pat. No. 5,907,188 entitled "Semiconductor Device with Conductive Oxidation Preventing Film and Method for Manufacturing the Same" granted May 25, 1999 to Nakajima et al. describes a semiconductor device that includes a semiconductor substrate, and a laminated film insulatively formed over the semiconductor substrate. A conductive oxidation preventing film is disposed between a refractory metal film and a semiconductor film, to prevent oxidation of the semiconductor film. Oxidation and diffusion barriers, i.e., single layers of W, WN, and WSiN, are mentioned in the specifications.

U.S. Pat. No. 5,985,762 entitled "Method of Forming a Self-Aligned Copper Diffusion Barrier in Vias" granted Nov. 16, 1999 to Geffken et al. describes a process whereby a copper diffusion barrier is formed on the side walls of vias connected to copper conductors, to prevent copper diffusion into inter-level dielectric. A thin film of copper diffusion barrier material is deposited on the wafer post via etch. A sputter etch is performed to remove barrier material from the base of via and to remove copper oxide from the copper conductor. The barrier material is not removed from the sidewall during the sputter etch. Thus, a barrier to re-deposited copper is formed on the via sidewalls to prevent copper poisoning of the dielectric. Barrier materials that are mentioned include single layers of: Ta, TiN, $Si_3N_4$, TaN, WN, WSiN, and TaSiN.

SUMMARY OF THE INVENTION

It is a general object of the present invention to provide an improved method of fabrication in the formation of an improved copper metal diffusion barrier layer having the structure, W/WSiN/WN, in single and dual damascene interconnect trench/contact via processing with 0.10 micron nodes for MOSFET and CMOS applications. The diffusion barrier is formed by depositing a tungsten nitride bottom layer, followed by an in situ $SiH_4/NH_3$ or $SiH_4/H_2$ soak forming a WSiN layer, and depositing a final top layer of tungsten. This invention is used to manufacture reliable metal interconnects and contact vias in the fabrication of MOSFET and CMOS devices for both logic and memory applications and the copper diffusion barrier formed, W/WSiN/WN, passes a stringent barrier thermal reliability test at 400° C. Pure single barrier layers, i.e., single layer WN, exhibit copper punch through or copper spiking during the stringent barrier thermal reliability test at 400° C.

In summary of the present invention, a process flow description follows that summarizes the necessary process steps and sequence of steps necessary for the main embodiments of the present invention, to form W/WSiN/WN barrier layer, which exhibits high diffusion resistance to both copper and silicon (at both interfaces). The necessary process steps and sequence of steps necessary to form the W/WSiN/WN are outlined, as follows. Step one is the deposition of the WN film or layer in the trench/via opening by metal-organic chemical vapor deposition (MOCVD) from the reduction of tungsten organic precursors, or deposited by plasma-enhanced chemical vapor deposition (PECVD), or by physical vapor deposition (PVD), sputtering. Step two in the process flow description is the an in situ soak process treating the WN layer with a $SiH_4/NH_3$ gas mixture or a $SiH_4/H_2$ gas mixture, at between from about 300 to 400° C. This reactive soak process forms a WSiN layer on top of the WN layer, thus a WSiN/WN barrier. Following the silane soak treatment, is step three, the final top barrier deposition by chemical vapor deposition (CVD) or physical vapor deposition (PVD), sputtering, of a tungsten layer. Thus, a W/WSiN/WN barrier layer is formed. Next, step four is the copper seed layer deposition with improved adhesion and copper crystal texture, preferred dense <111>, upon the rigid diffusion the barrier layer, W/WSiN/WN. This fine crystal texture is important for subsequent electrochemical deposition (ECD) of copper, which subsequently fills the trench/via cavity. The copper seed layer, deposited over the tungsten layer, exhibits fine, highly dense grains, as studied by scanning electron microscopy (SEM). The subsequent process step, the electrochemical deposition (ECD) of copper, is used to fill the trench cavity, upon the copper seed layer. The kinetics of the electrochemical copper deposition process are based on a uniform, defect-free seed layer and barrier layer with good adhesion properties. The underlying layers improve and make wider the process window for the deposition of copper to fill both single and dual damascene structures.

The final processing step in building of the single and dual damascene structure is the chemical mechanical polishing (CMP) back of the excess electrochemical deposited copper metal. The copper is chem-mech polished back without dishing. In addition, any excess seed layer and barrier layer are removed from the top substrate surface. The copper is polished back so that only the copper that lies in the openings is left to form single and dual inlaid structures that include via and interconnect portions. Device applications include MOSFET and CMOS devices.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

It is a general object of the present invention to provide an improved method of fabrication in the formation of an improved copper metal diffusion barrier layer having the structure, W/WSiN/WN, in single and dual damascene interconnect trench/contact via processing with 0.10 micron nodes for MOSFET and CMOS applications. The diffusion barrier is formed by depositing a tungsten nitride bottom layer, followed by an in situ $SiH_4/NH_3$ or $SiH_{4/H2}$ soak forming a WSiN layer, and depositing a final top layer of tungsten. This invention is used to manufacture reliable metal interconnects and contact vias in the fabrication of MOSFET and CMOS devices for both logic and memory applications and the copper diffusion barrier formed, W/WSiN/WN, passes a stringent barrier thermal reliability test at 400° C. Pure single barrier layers, i.e., single layer WN, exhibit copper punch through or copper spiking during the stringent barrier thermal reliability test at 400° C.

It has been found that one reason that just a WN layer alone does not work, as well as, a W/WSiN/WN composite barrier layer is the possibility of pin holes in the WN layer. Pin holes facilitate the movement (through fast surface diffusion) of copper through the WN layer, during subsequent thermal processing, resulting in copper spiking or punch through of the barrier.

Figure 1:
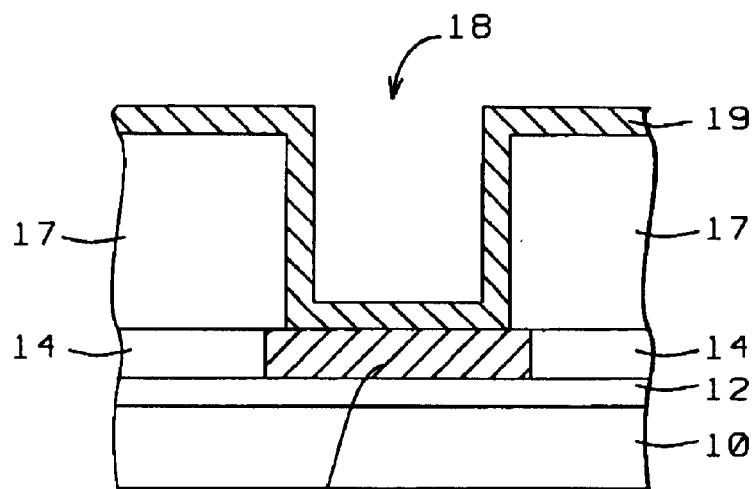
FIG. 1, which in cross-sectional representation illustrates a trench structure filled with the first layer of the copper metal barrier layer, WN, deposited by metal-organic chemical vapor deposition (MOCVD) from the reduction of tungsten organic precursors, or deposited by plasma-enhanced chemical vapor deposition (PECVD), or by physical vapor deposition (PVD), sputtering.

Referring to FIG. 1 illustrated in cross-sectional drawing, for completeness provided by the present invention, is a semiconductor substrate 10 with an insulating layer 12. A copper metal interconnect 16 is patterned within an insulating layer 14. In addition, a layer of low dielectric constant material 17 is deposited and patterned into a trench 18 (gap) opening in FIG. 1. Provided is a single damascene structure 18 and/or a dual damascene structure (not shown in FIGS.). The typical insulator material is silicon oxide type compounds. Also, polysilicon gate structures (with silicides) and source/drain diffusions are typically upon or in a single crystal silicon substrate or IC module (not shown in figures).

Referring again in more detail to FIG. 1, which is a cross-sectional representation shows the first embodiment of the present invention, a trench structure filled with the first layer of the copper metal barrier layer, WN (19), deposited by metal-organic chemical vapor deposition (MOCVD) from the reduction of tungsten organic precursors, or deposited by plasma-enhanced chemical vapor deposition (PECVD), or by physical vapor deposition (PVD), sputtering.

Figure 2:
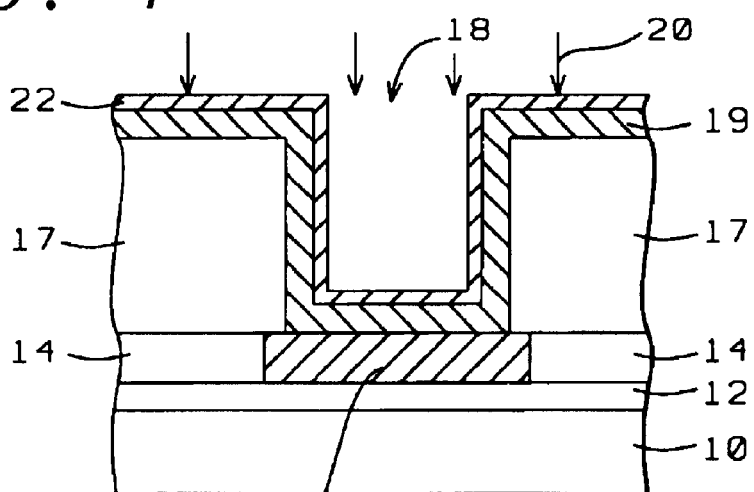
FIG. 2, which in cross-sectional representation illustrates the in situ soak process treating the WN layer with an in situ $SiH_4/NH_3$ or $SiH_4/H_2$ soak at between 300 and 400° C. forming a WSiN layer on top of the WN layer, thus WSiN/WN barrier.

Referring to FIG. 2, which in cross-sectional representation illustrates one of the main embodiments of the current invention, an in situ soak process treating the WN layer (19) with a $SiH_4/NH_3$ gas mixture (20) or a $SiH_4/H_2$ gas mixture (20), at between from about 300 to 400° C. This reactive soak process forms a WSiN layer (22) on top of the WN layer (19), thus forming a WSiN/WN barrier. Silicon atoms diffuse between the gains and into the grain boundaries of the WN film. Therefore, the silicon atoms block the diffusion path of deleterious copper atoms.

Figure 3:
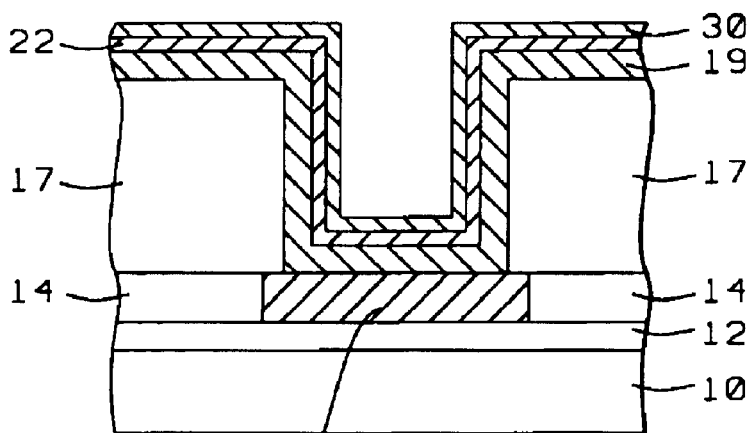
FIG. 3, which in cross-sectional representation illustrates the final top barrier deposition by chemical vapor deposition (CVD) or physical vapor deposition (PVD), sputtering, of tungsten, thus forming W/WSiN/WN barrier layer.

Referring to FIG. 3, illustrated in cross-sectional drawing is shown the result of the main embodiments of the current invention, the final top barrier deposition by chemical vapor deposition (CVD) or physical vapor deposition (PVD), sputtering, of tungsten (30). Thus, a W/WSiN/WN barrier layer is formed. The top tungsten barrier layer (30) is deposited over the WSiN layer (22) and the bottom WN layer (19). This top tungsten barrier layer yields better copper seed layer properties in the next process step.

Figure 4:
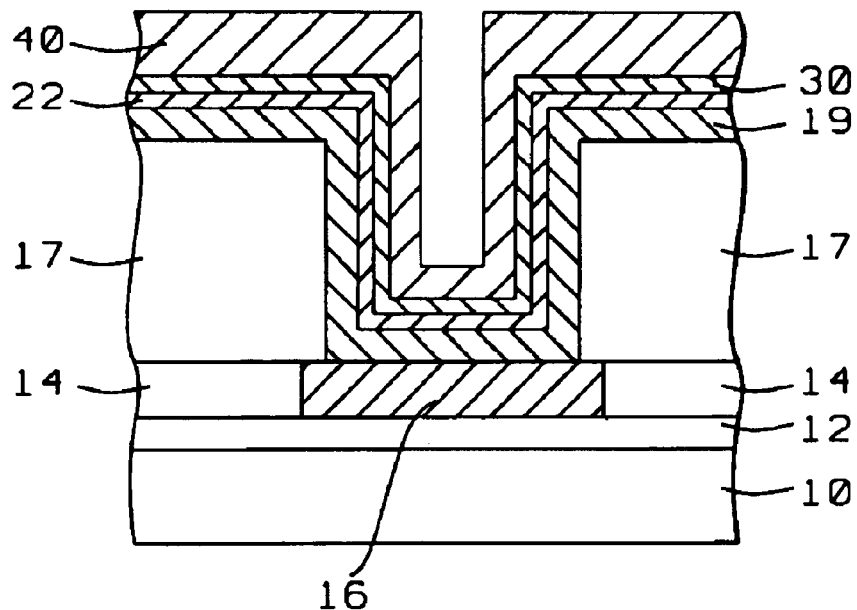
FIG. 4, which in cross-sectional representation illustrates another embodiment of the present invention, the copper seed layer with improved adhesion and copper crystal texture, upon the rigid diffusion the barrier layer, W/WSiN/WN, for subsequent electrochemical deposition (ECD) of copper to fill the trench/via cavity.

FIG. 4, which in cross-sectional representation illustrates another embodiment of the present invention, the copper seed layer (40) deposition with improved adhesion and copper crystal texture, preferred dense <111>, upon the rigid diffusion the barrier layer, W/WSiN/WN. This fine crystal texture is important for subsequent electrochemical deposition (ECD) of copper, which subsequently fills the trench/via cavity. The copper seed layer (40) deposited over the tungsten layer (30) exhibits fine, highly dense grains, as studied by scanning electron microscopy (SEM). 9. The trench or channel and the via hole contact is lined with the adhesive copper seed layer on the diffusion barrier layer. The copper seed layer can be deposited by several methods: electrochemical deposition (ECD), or by physical vapor deposition (PVD) sputtering, and the seed layer material is comprised of a copper metal layer, thickness from about 1,000 to 2,200 Angstroms by PVD, and thickness from about 200 to 500 Angstroms by chemical vapor deposition (CVD).

Figure 5:
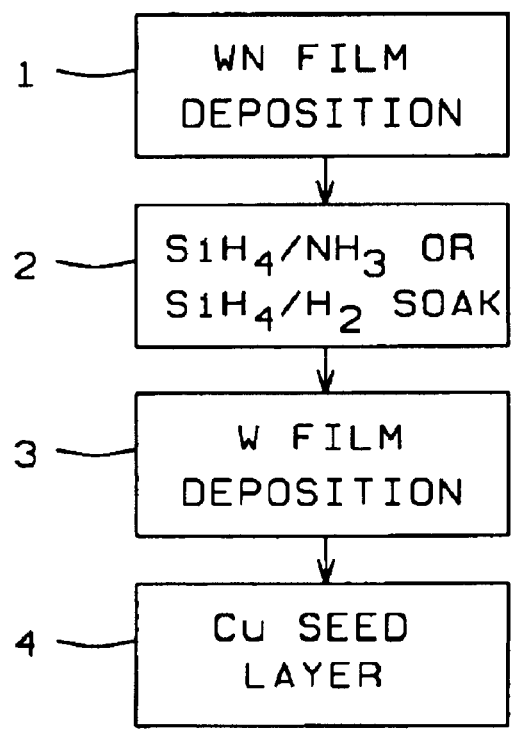
FIG. 5, includes a process flow diagram summarizes the necessary process steps and sequence of steps necessary for an embodiment of the present invention, to form W/WSiN/WN barrier layer, which exhibits high diffusion resistance to both copper and silicon (at both interfaces).

FIG. 5, includes a process flow diagram summarizes the necessary process steps and sequence of steps necessary for an embodiment of the present invention, to form W/WSiN/WN barrier layer, which exhibits high diffusion resistance to both copper and silicon (at both interfaces). The necessary process steps and sequence of steps necessary to form the W/WSiN/WN are outlined in FIG. 5. Step one (1) is the deposition of the WN film or layer in the trench/via opening by metal-organic chemical vapor deposition (MOCVD) from the reduction of tungsten organic precursors, or deposited by plasma-enhanced chemical vapor deposition (PECVD), or by physical vapor deposition (PVD), reactive sputtering. Step two (2) in the flow diagram is the an in situ soak process treating the WN layer with a $SiH_4/NH_3$ gas mixture or a $SiH_4/H_2$ gas mixture, at between from about 300 to 400° C. This reactive soak process forms a WSiN layer on top of the WN layer, thus a WSiN/WN barrier. Following the silane soak treatment, is step three (3), the final top barrier deposition by chemical vapor deposition (CVD) or physical vapor deposition (PVD), sputtering, of a tungsten layer. Thus, a W/WSiN/WN barrier layer is formed. Next, step four (4) is the copper seed layer deposition with improved adhesion and copper crystal texture, preferred dense <111>, upon the rigid diffusion the barrier layer, W/WSiN/WN. This fine crystal texture is important for subsequent electrochemical deposition (ECD) of copper, which subsequently fills the trench/via cavity. The copper seed layer, deposited over the tungsten layer, exhibits fine, highly dense grains, as studied by scanning electron microscopy (SEM). Not shown in the FIGS., is the subsequent process step, the electrochemical deposition (ECD) of copper, used to fill the trench cavity, upon the copper seed layer. The kinetics of the electrochemical copper deposition process are based on a uniform, defect-free seed layer and barrier layer with good adhesion properties. The underlying layers improve and make wider the process window for the deposition of copper to fill both single and dual damascene structures.

The final processing step in building of the single and dual damascene structure is the chemical mechanical polishing (CMP) back of the excess electrochemical deposited copper metal. The copper is chem-mech polished back without dishing. In addition, any excess seed layer and barrier layer are removed from the top substrate surface. The copper is polished back so that only the copper that lies in the openings is left to form single and dual inlaid structures that include via and interconnect portions. Device applications include MOSFET and CMOS devices. Robust diffusion barriers are critical to these technologies since copper is an excellent mid-band gap, recombination center in semiconductor material and minor carrier lifetime, retention time, is severely reduced by copper contamination in the semiconductor device regions.

Some of the process details and specifications for the in situ soak process, are as follows. The in situ soak process treats the WN layer with a $SiH_4/NH_3$ gas mixture or a $SiH_4/H_2$ gas mixture, at between from about 300 to 400° C. This reactive soak process forms a WSiN layer on top of the WN layer, thus forming a WSiN/WN barrier. Gas pressure ranges from about 1 to 10 Torr. Gas flows are, with a $SiH_4/NH_3$ gas mixture, $SiH_4$ gas flow from about 40 to 60 scam and $NH_3$ gas flow from about 5 to 10 sccm. Gas flows are, with a $SiH_4/H_2$ gas mixture, $SiH_4$ gas flow from about 40 to 60 sccm and $H_2$ gas flow from about 2 to 3 sccm. Reaction time at processing temperature ranges from about 6 to 60 seconds. The WSiN layer thickness, formed by the above process, is from approximately 30 to 60 Angstroms. (Note, the in situ soak process that treats the WN layer, as specified above, is intentionally not a plasma process.)

Some of the specifications for the sandwich barrier structure or barrier layer W/WSiN/WN, are as follows. For a 300 Angstrom barrier layer of W/WSiN/WN, W thickness is approximately 40 Angstroms, WSiN thickness is from approximately 30 to 60 Angstroms, and WN thickness is approximately 200 Angstroms. If the total barrier layer W/WSiN/WN thickness is made to be thicker or thinner than 300 Angstroms, this has the effect of either increasing or decreasing only the WN thickness, as shown in the following example. For example, for a total barrier layer W/WSiN/WN thickness of 200 Angstroms, the W thickness is still approximately 40 Angstroms, WSiN thickness is still from approximately 30 to 60 Angstroms, but the affected WN thickness is now approximately 100 Angstroms. In general terms, the trench or channel and via hole contact is lined with a diffusion barrier layer comprised of a composite barrier with top layer of W thickness from about 30 to 50 Angstroms, interposed or intervening layer of WSiN thickness from about 30 to 60 Angstroms, and bottom layer of WN thickness from about 60 to 400 Angstroms.

One process variation or process option of the present invention, is as follows. The tungsten layer of the W/WSiN/WN barrier layer can be omitted to form a WSiN/WN barrier layer. Omitting the tungsten layer and the associated processing to deposit that layer, has the following affects on the barrier layer properties. Comparing the top of the barrier layer, W versus WSiN, W has a better crystal texture than WSiN. More specifically, WSiN is an amorphous phase or "nano-crystalline" phase (very small crystals or grains, close to amorphous). The properties of the conducting copper metal, that is deposited upon the barrier layer, are dependent upon the barrier layer material that is on the top surface of the barrier layer. A specific example of this barrier layer surface affect on the deposited copper layer properties is as follows. A barrier layer with W on top has the following properties: the tungsten layer has a better grain or crystal texture (finer texture) than a top layer of WSiN layer. Furthermore, the if copper is directly deposited on a layer of WSiN, the copper grains exhibit less of the desirable preferred crystal orientation <111>/<200>. However, if copper is directly deposited on a layer of W, the copper grains exhibit more of the desirable preferred crystal orientation <111>/<200>. This effect is attributed to the better crystal texture of the tungsten layer. In cases where the process variation or process option of omitting the W top layer is exercised, the trench or channel and via hole contact is lined with a diffusion barrier layer comprised of a composite barrier with a top layer of WSiN thickness from about 30 to 60 Angstroms, and a bottom layer of WN thickness from about 60 to 400 Angstroms.

While the invention has been particularly shown and described with reference to the preferred embodiments thereof, it will be understood by those skilled in the art that various changes in form and details may be made without departing from the spirit and scope of the invention.

What is claimed is:

1. A method of preventing copper diffusion in the fabrication of an integrated circuit by means of a composite diffusion barrier layer, and forming conducting inlaid copper, the method comprising the following steps:

(a) providing a substrate or wafer having an insulator layer deposited upon said substrate;

(b) providing a first level of conducting wiring over said insulator layer;

(c) depositing a first and second dielectric layer over said first level of conducting wiring;

(d) patterning and etching the dielectric layers forming dual damascene trench/via openings;

(e) depositing a WN first barrier layer over said dielectric layers covering and lining said trench/via;

(f) soaking said WN first barrier layer in a reactive silane gas mixture forming a WSiN layer on the WN;

(g) depositing a W barrier layer over the WN first barrier layer and on the WSiN layer, forming over dual damascene trench/via openings, by the above process steps (a) to (g), a composite diffusion barrier layer comprised of W/WSiN/WN, with a WN first barrier layer, followed by a WSiN layer on the WN first barrier layer, and then followed by a W barrier layer on the WSiN layer;

(h) depositing by electrochemical deposition a copper seed layer over the diffusion barrier layer;

(i) depositing by electrochemical deposition a copper conducting material on the copper seed layer forming an excess of copper, and removing the excess material, thus forming conducting inlaid copper.

2. The method of claim 1, wherein the substrate or wafer is semiconductor single crystal silicon or an IC module, with MOSFET or CMOS devices therein.

3. The method of claim 1, wherein both first and second dielectric layers are selected from the group consisting of low dielectric materials, silicon dioxide and silicon oxide.

4. The method of claim 1, wherein the first barrier layer of WN is deposited by metal-organic chemical vapor deposition (MOCVD) from the reduction of tungsten organic precursors, or deposited by plasma-enhanced chemical vapor deposition (PECVD), or by physical vapor deposition (PVD), reactive sputtering, in the thickness range from about 60 to 400 Angstroms.

5. The method of claim 1, wherein the W barrier layer on the WSiN layer is deposited by chemical vapor deposition (CVD) or by physical vapor deposition (PVD), sputtering, in the thickness range from about 30 to 50 Angstroms.

6. The method of claim 1, wherein the trench or channel and via hole contact is lined with a diffusion barrier layer comprised of a composite diffusion barrier layer comprised of W/WSiN/WN, with a WN first barrier layer thickness from about 30 to 50 Angstroms, followed by a WSiN layer on the WN first barrier layer thickness from about 30 to 60 Angstroms, and then followed by a W barrier layer thickness from about 30 to 50 Angstroms on the WSiN layer.

7. The method of claim 1, wherein the trench or channel and via hole contact is lined with a diffusion barrier layer comprised of a composite barrier with top layer of W thickness from about 30 to 50 Angstroms, interposed or intervening layer of WSiN thickness from about 30 to 60 Angstroms, and bottom layer of WN thickness from about 60 to 400 Angstroms.

8. The method of claim 1, wherein the WN barrier layer is treated by an in situ soak process, whereby, a reactant silane gas mixture of either silane and ammonia, or silane and hydrogen, at between about 300 to 400° C., forms a WSiN compound layer from about 30 to 60 Angstroms thick on the surface of the WN barrier layer.

9. The method of claim 1, wherein the copper seed layer is deposited by physical vapor deposition sputtering, and the seed layer material is comprised of copper metal thickness from about 1,000 to 2,200 Angstroms.

10. The method of claim 1, wherein the copper conducting material on the copper seed layer for subsequent conducting interconnect lines and via contacts is comprised of the following conducting type materials:

electrochemical deposition of copper, upon the copper seed layer.

11. The method of claim 1, wherein the copper conducting material on the copper seed layer is electrochemically deposited in the trench/via structures with a wide process window upon said seed layer and said barrier layer, with a fine grained <111> texture.

12. The method of claim 1, wherein the excess of copper is planarized by removing excess material, the method being selected from the group comprised of:

planarization by chemical mechanical polish (CMP), milling, ion milling, and/or etching, which leave the copper in trench/via openings, forming single and dual inlaid structures that include conducting interconnect lines and contact vias.

13. The method of claim 1, wherein multilevel conducting inlaid copper is fabricated by repeating the process steps (c) through (i) described heroin.

14. A method of preventing copper diffusion in the fabrication of an integrated circuit by means of a composite diffusion barrier layer, and forming conducting damascene inlaid copper, the method comprising the following steps:

(a) providing a substrate or wafer having an insulator layer deposited upon said substrate;

(b) providing a first level of conducting wiring over said insulator layer;

(c) depositing a first and second dielectric layer over said first level of conducting wiring;

(d) patterning and etching the dielectric layers forming dual damascene trench/via openings;

(e) depositing a WN first barrier layer over said dielectric layers covering and lining said trench/via;

(f) soaking said WN first barrier layer in a reactive silans gas mixture forming a WSiN layer on the WN;

(g) depositing a W barrier layer over said WN first barrier layer and over said WSiN layer, forming a composite barrier layer consisting of top layer to bottom layer of W/WiN/WN diffusion barrier layer;

(h) depositing by electrochemical deposition (ECD) a copper seed layer over said diffusion barrier layer;

(i) depositing by electrochemical deposition (ECD) copper conducting material over said copper seed layer forming an excess of copper, and removing the excess material layers to form conducting damascene inlaid copper, in the fabrication of copper interconnect wiring and contact vias.

15. The method of claim 14, wherein the substrate or wafer is semiconductor single crystal silicon or an IC module, with MOSFET or CMOS devices therein.

16. The method of claim 14, wherein both first and second dielectric layers are selected from the group consisting of low dielectric materials, silicon dioxide and silicon oxide.

17. The method of claim 14, wherein the first barrier layer of WN is deposited by metal-organic chemical vapor deposition (MOCVD) from the reduction of tungsten organic precursors, or deposited by plasma-enhanced chemical vapor deposition (PECVD), or by physical vapor deposition (PVD), reactive sputtering, in the thickness range from about 60 to 400 Angstroms.

18. The method of claim 14, wherein the top barrier layer of W is deposited by chemical vapor deposition (CVD) or by physical vapor deposition (PVD), sputtering, in the thickness range from about 30 to 50 Angstroms.

19. The method of claim 14, wherein the trench or channel and via hole contact is lined with a diffusion barrier layer comprised of a composite barrier with top layer of WSiN thickness from about 30 to 60 Angstroms, and bottom layer of WN thickness from about 60 to 400 Angstroms.

20. The method of claim 14, wherein the trench or channel and via hole contact is lined with a diffusion barrier layer comprised of a composite barrier with top layer of W thickness from about 30 to 50 Angstroms, interposed or intervening layer of WSiN thickness from about 30 to 60 Angstroms, and bottom layer of WN thickness from about 60 to 400 Angstroms.

21. The method of claim 14, wherein the WN barrier layer is treated by an in situ soak process, whereby, a reactant silane gas mixture of either silane and ammonia, or silane and hydrogen, at between about 300 to 400° C., forms a WSiN compound layer from about 30 to 60 Angstroms thick on the surface of the WN barrier layer.

22. The method of claim 14, wherein in the trench or channel and the via hole contact is lined with an adhesive copper seed layer on the diffusion barrier layer, the copper seed layer being deposited by electrochemical deposition (ECD), or by physical vapor deposition (PVD) sputtering, and the seed layer material is comprised of copper metal layer, thickness from about 1,000 to 2,200 Angstroms by PVD, and thickness from about 200 to 500 Angstroms by chemical vapor deposition (CVD).

23. The method of claim 14, wherein the conducting material layers for conducting interconnect lines and via contacts comprise the following conducting type materials: electrochemical deposition (ECD) of copper, upon the copper seed layer.

24. The method of claim 14, wherein the ECD copper is electrochemically deposited in the trench/via structures with a wide process window upon said seed layer and said barrier layer, with a fine grained <111> texture.

25. The method of claim 14, wherein each level of conducting structure is planarized by removing excess material, the method being selected from the group consisting of: planarization by chemical mechanical polish (CMP), milling, ion milling, and/or etching, which leave the copper in trench/via openings, forming single and dual inlaid structures that include conducting interconnect lines and contact vias.

26. The method of claim 14, wherein multilevel conducting structures are fabricated by repeating the process steps (c) through (i) described herein.

* * * * *